(12) United States Patent
Dussarrat

(10) Patent No.: US 8,377,511 B2
(45) Date of Patent: Feb. 19, 2013

(54) METHOD FOR DEPOSITING SILICON NITRIDE FILMS AND/OR SILICON OXYNITRIDE FILMS BY CHEMICAL VAPOR DEPOSITION

(75) Inventor: Christian Dussarrat, Wilmington, DE (US)

(73) Assignee: L'Air Liquide Societe Anonyme pour l'Etude et l'Exploitation des Procedes Georges Claude, Paris (FR)

( * ) Notice: Subject to any disclaimer, the term of this patent is extended or adjusted under 35 U.S.C. 154(b) by 589 days.

(21) Appl. No.: 12/295,907

(22) PCT Filed: Apr. 3, 2006

(86) PCT No.: PCT/EP2006/061284
§ 371 (c)(1),
(2), (4) Date: May 11, 2010

(87) PCT Pub. No.: WO2007/112780
PCT Pub. Date: Oct. 11, 2007

(65) Prior Publication Data
US 2010/0221428 A1    Sep. 2, 2010

(51) Int. Cl.
*C23C 16/34* (2006.01)
(52) U.S. Cl. ...... 427/255.29; 427/255.393; 427/255.394
(58) Field of Classification Search ........... 427/255.393, 427/255.394, 255.29
See application file for complete search history.

(56) References Cited

U.S. PATENT DOCUMENTS

| 5,874,368 | A | 2/1999 | Laxman et al. |
| 7,019,159 | B2 * | 3/2006 | Dussarrat et al. ............. 556/410 |
| 7,064,083 | B2 * | 6/2006 | Dussarrat et al. ............. 438/769 |
| 2004/0096582 | A1 * | 5/2004 | Wang et al. ............... 427/255.27 |
| 2004/0121085 | A1 * | 6/2004 | Wang et al. .................... 427/569 |
| 2004/0203255 | A1 | 10/2004 | Itsuki |
| 2006/0286819 | A1 * | 12/2006 | Seutter et al. ................. 438/791 |
| 2007/0160774 | A1 * | 7/2007 | Tsukada et al. ............... 427/579 |
| 2010/0016620 | A1 * | 1/2010 | Dussarrat ..................... 556/410 |

FOREIGN PATENT DOCUMENTS

| WO | WO 03 045959 | 6/2003 |
| WO | WO 03 046253 | 6/2003 |
| WO | WO 2004 017383 | 2/2004 |
| WO | WO 2004 044958 | 5/2004 |
| WO | WO 2004 057653 | 7/2004 |
| WO | WO 2005 045899 | 5/2005 |
| WO | WO 2005 066386 | 7/2005 |

OTHER PUBLICATIONS

Wan, Yanjian, et al., "Synthesis of (Dialkylamino)disilanes". Inorg. Chem. 1993, 32, 341-344.*
Schuh, Heinz, et al., "Disilanyl-amines—Compounds Comprising the Structural Unit Si-Si-N, as Single-Source Precursors for Plasma-Enhanced Chemical Vapor Deposition (PE-CVD) of Silicon Nitride". Z. anorg. allg. Chem. 619 (1993) 1347-1352.*
International Search Report for PCT/EP2006/061284.
Wan, Y. et al., "Synthesis of (dialkylamino)disilanes," Inorg. Chem. 1993, 32, pp. 341-344.

* cited by examiner

*Primary Examiner* — Bret Chen
(74) *Attorney, Agent, or Firm* — Patricia E. McQueeney

(57) ABSTRACT

Disclosed are CVD deposition of SiN and SiON films using pentakis(dimethylamino)disilane compounds along with a nitrogen containing gas and optionally an oxygen containing gas.

16 Claims, 2 Drawing Sheets

METHOD FOR DEPOSITING SILICON NITRIDE FILMS AND/OR SILICON OXYNITRIDE FILMS BY CHEMICAL VAPOR DEPOSITION

This application is a 371 of International PCT Application PCT/EP2006/061284, filed Apr. 3, 2006.

This invention relates to methods for producing silicon nitride films and silicon oxynitride films by chemical vapor deposition (CVD).

BACKGROUND OF THE INVENTION

Silicon nitride films are known to exhibit excellent barrier properties and an excellent oxidation resistance and are used, for example, as etch-stop layers, barrier layers, gate insulation layers, gate spacers, advanced gate dielectric, ONO stacks or the like in the manufacture of semi-conductor devices.

The main technologies in use at the present time for the formation of thin silicon nitride oroxynitride films are plasma-enhanced CVD (PECVD) and low-pressure CVD (LPCVD).

In PECVD, a silicon source (typically a silane) and a nitrogen source (such as, for example, ammonia but also nitrogen) are introduced between a pair of parallel-plate electrodes and radio-frequency energy is applied between the two electrodes at low temperatures (about 300° C.) and intermediate pressures (0.1 to 5 Torr or 1 to 630 Pa) in order to generate a plasma from the silicon source and nitrogen source. Active silicon species and active nitrogen species in the generated plasma react with each other to produce a silicon nitride film.

The silicon nitride films produced by PECVD generally do not have a stoichiometric composition and are also hydrogen rich. As a result, these silicon nitride films have a low film density and a high etch rate and are of poor quality. They are often referred to as SiNH, since they contain up to 30% H atomic. However, PECVD is not preferred for front end applications (FEOL) because of the damages that may be generated by the plasma at the semi-conductors surface.

Thermal LPCVD which does not employ a plasma, is used to deposit high-quality silicon nitride films. LPCVD as it is currently practiced uses low pressures (0.1 to 2 Torr) and high temperatures (750-900° C.) and produces silicon nitride or oxynitride films of a quality superior to that of the corresponding films produced by PECVD. Silicon nitride films made by using LPCVD technology, are generally obtained by the reaction of dichlorosilane (DCS) and ammonia gas. However, the existing LPCVD technology requires fairly high temperatures in order to obtain acceptable deposition (film formation) rates ($\geq 10$ Å/minute) for silicon nitride films. For example, temperatures of 750 to 800° C. are typically used for the reaction of DCS and ammonia. In addition, the reaction of DCS and ammonia produces large amounts of ammonium chloride, which can accumulate in and clog the exhaust piping system of the CVD reaction apparatus.

A number of silicon nitride precursors have been introduced for the purpose of obtaining satisfactory silicon nitride film deposition rates at low temperatures. Hexachlorodisilane (HCDS) is one example of such precursors. HCDS produces $SiCl_2$ at relatively low temperatures by the reaction $Si_2Cl_6 \rightarrow SiCl_2 + SiCl_4$ and this $SiCl_2$ reacts effectively with ammonia. The use of HCDS can provide silicon nitride film deposition at film formation rates of approximately 10 Å/minute at 600° C.

Another example of a silicon nitride precursor is the bis(tert-butylamino)silane (BTBAS) described in U.S. Pat. No. 5,874,368. BTBAS enables the deposition of silicon nitride films at a film formation rate of approximately 10 Å/minute at 600° C.

While both HCDS and BTBAS can achieve film formation rates of approximately 10 Å/minute at 600° C., this performance level also means that commercially acceptable film formation rates will not be obtained at temperatures lower than 550° C. Furthermore, these precursors have also the following drawbacks:

HCDS, being a completely chlorinated disilane, has a high chlorine content, and the Si—Cl bond is also very strong. As a consequence, the chlorine content in the resulting silicon nitride film will increase as the reaction temperature declines, and it has been found that the chlorine content can be as high as about 2% (atom based) in a film obtained at a 600° C. reaction temperature. In addition, the use of HCDS also leads to the production of large amounts of ammonium chloride just as in the case of DCS.

BTBAS has an activation energy of 56 kcal/mole, with the result that its silicon nitride film formation rate declines drastically when the reaction temperature is reduced. It is estimated that its film formation rate drops to a quite small 3 Å/minute at a reaction temperature of 550° C.

It is also known to use tetrakis(ethylamino) silane ("TEAS") as a Si precursor to manufacture films at a similar growth rate than the grow rate obtained with BTBAS but with different film properties.

The same problems appear when the aforementioned prior art precursors are used to produce silicon oxynitride films, which have the same physical properties and applications as silicon nitride films.

It is also known from PCT WO03/045959 et PCT WO03/046253 that hexathylaminodisilane which provide for better Si precursors to manufacture films at growth rates of 10 Å or more at temperatures substancially lower than HCDS or BTAS.

The issue addressed by this invention, therefore, is to provide a method for the production of silicon nitride and silicon oxynitride films by CVD technology, wherein said method provides acceptable film formation rates at lower temperatures and is not accompanied by the production of large amounts of ammonium chloride.

SUMMARY OF THE INVENTION

A first aspect of this invention provides a method for producing silicon nitride films by chemical vapor deposition in a reaction chamber comprising the steps of:

a) introducing a substrate into the reaction chamber, having a surface adapted to receive a film;

b) introducing a pentakis(dimethylamino) disilane comprising compound with the general formula $$Si_2(NMe_2)_5Y \qquad (I)$$

wherein Y is selected from the group comprising Cl, H and an amino group;

c) introducing a nitrogen-containing gas selected from the group comprising ammonia, hydrazine, alkylhydrazine, and hydrogen azide compounds into the reaction chamber; and d) forming a silicon nitride film onto at least a portion of the surface of the substrate by reacting the disilane containing compound and the nitrogen-containing gas at a reaction temperature, which is preferably at least equal to the substrate surface temperature.

Preferably, the process also comprises the steps of heating the substrate up to at least a temperature of 300° C. on the substrate surface and preferably below 650° C.

A second aspect of this invention provides a method for producing silicon oxynitride films by chemical vapor deposition in a reaction chamber, comprising the steps of:
 a) introducing a substrate unto the reaction chamber, this substrate having a surface adapted to receive a film deposited thereon;
 b) introducing a pentakis(dimethylamino) disilane comprising compound with the general formula (I):

wherein Y is selected from the groups comprising Cl, H and an amino group.
 c) introducing a nitrogen-containing gas selected from the group comprising ammonia, hydrazine, alkylhydrazine compounds, and hydrogen azide compounds into the reaction chamber
 d) introducing an oxygen-containing gas selected from the group comprising NO, $N_2O$, $NO_2$, $O_2$, $O_3$, $H_2O$, and $H_2O_2$ into the reaction chamber loaded with at least a substrate
 e) forming a silicon oxynitride film onto at least a portion of the surface of the substrate by reacting the disilane compound, the nitrogen-containing gas, and the oxygen-containing gas at a reaction temperature, which is preferably at least equal to the substrate surface temperature. For both of the process of the invention, the disilane comprising compound shall contain less than 5% vol. of $Si_2(NMe_2)_6$. Preferably the amino group shall be $NH(C_nH_{2n+1})$ with $0 \leq n \leq 5$, while Y shall be preferably a Cl atom.

DETAILED DESCRIPTION OF THE INVENTION

Pentakis(dimethylamino) chloro disilane $Si_2(NMe_2)_5Cl$ can be synthesized by reacting hexachlorodisilane ($Cl_3Si$—$SiCl_3$) in an organic solvent with at least 5-fold moles of dimethylamine $(CH_3)_2NH$.

However, the use of an excess of dimethylamine (beyond 5-fold) over hexachlorodisilane is preferred. More particularly, the use of a hexachlorodisilane:dimethylamine molar ratio of 1:10 to 1:20 is preferred. The use of at least 10 moles dimethylamine per 1 mole hexachlorodisilane also enables trapping, the hydrogen chloride (6 moles) that is produced as a by-product in the reaction to make dimethylammonium chloride (solid). This dimethylammonium chloride can be easily removed from the reaction mixture by filtration.

Organic solvent may be used as the reaction solvent for reaction of the hexachlorodisilane and dimethylamine. This organic solvent may be tetrahydrofuran, linear chain branched or cyclic hydrocarbons such as pentane, hexane, and octane. However, n-hexane is the preferred solvent.

The reaction between hexachlorodisilane and dimethylamine is preferably run at a temperature from −30° C. to +50° C. In general, this reaction will be run by first bringing the reaction solvent to a temperature in the preferred range of −30° C. to +50° C., adding/dissolving the dimethylamine in the reaction solvent; and then gradually adding the hexachlorodisilane, for example, by dropwise addition. The hexachlorodisilane can be dropped in either pure or dissolved in the same solvent as the reaction solvent. The reaction is subsequently run for 2 to 24 hours while stirring the reaction solvent and holding at the aforementioned temperature. After this period of stirring, the reaction solvent is heated to room temperature (approximately 20° C. to 50° C.) and stirring is preferably continued for at least another 10 hours. The dimethylammonium chloride, a solid by-product, is then removed by filtration and the solvent and residual amine are distilled off in vacuo. The resulting pentakis(dimethylamino) chloro disilane can be subjected to additional purification by fractional distillation.

The resulting pentakis(dimethylamino) chloro disilane can be itself used as a starting material for other attractive materials for silicon carbonitride precursors. One of them is pentakis(dimethylamino) disilane $Si_2(NMe_2)_5H$. It can be formed by reduction of pentakis(dimethylamino) chloro disilane using lithium aluminum hydride or sodium boron hydride.

Pentakis(dimethylamino) monoethylamine disilane $Si_2(NMe_2)_5(NHEt)$ is another molecule of interest. It can be formed by ammonolysis of pentakis(dimethylamino) chloro disilane using monoethylamine. Similar pentakis(dimethylamino) amine disilane $Si_2(NMe_2)_5(NHR)$ where R represents hydrogen or a $C_1$-$C_4$ chain either linear, branched or cyclic, can be manufactured.

Pentakis(dimethylamino) chloro disilane and its derivatives according to this invention contain five dimethylamino-ligands, and are highly reactive and support excellent silicon nitride and silicon carbonitride film deposition rates by CVD at low temperatures (between usually 350-500° C.).

The disilane compounds described above can be used in the semiconductor industry as precursors for the manufacture by CVD of silicon nitride and silicon carbonitride dielectric films e.g. for sidewall spacers or etch stop film. They can also be used to carry out silicon oxynitride and silicon carbo oxynitride films by introducing an oxygen containing gas in the reaction chamber.

It is also preferred to preheat the substrate onto which the film will be deposited at a temperature within the range of the temperature deposition of the film on the substrate, e.g. at least 300° C.

In order to form silicon nitride using the disilane compounds according to the invention (I), at least one of said disilane compounds (I) and at least one nitrogen-containing gas are admitted into the reaction chamber loaded with at least a substrate (typically a semiconductor substrate such as a silicon substrate) and silicon nitride is deposited on the surface of the semiconductor substrate by reacting the disilane compound and the nitrogen-containing gas at the reaction temperature. The nitrogen-containing gas can be selected from the group consisting of ammonia, hydrazine, alkylhydrazine compounds, and hydrogen azide.

The molar ratio between the disilane compound and the nitrogen-containing gas admitted into the reaction chamber during silicon nitride production is preferably 1:0 to 1:50. The total pressure within the reaction chamber is preferably maintained at a pressure between 0.1 and 10 Torr. The reaction temperature is preferably from 300° C. to 650° C.

In order to form silicon oxynitride using the inventive disilane compounds (I), the at least one of said disilane compounds (I), at least one nitrogen-containing gas, and oxygen-containing gas are admitted separately, together or alternatively (ALD process) into the reaction chamber loaded with at least one substrate (typically a semiconductor substrate such as a silicon substrate) and a silicon oxynitride film is deposited onto the surface of the substrate by reacting the disilane compound, the nitrogen-containing gas and the oxygen-containing gas at the reaction temperature. As with silicon nitride film deposition, the nitrogen-containing gas can be selected from the group consisting of ammonia, hydrazine, and hydrogen azide, while the oxygen-containing gas can be selected from the group consisting of NO, $N_2O$, $NO_2$, $O_2$, $O_3$, $H_2O$, and $H_2O_2$.

When the oxygen-containing gas also contains nitrogen (NO, $N_2O$, and/or $NO_2$), a nitrogen-containing gas does not need to be used and the ratio between the disilane compound and the nitrogen-containing gas admitted into the reaction chamber during silicon oxynitride production is preferably 1:0 to 1:50. When the oxygen-containing gas does not contain nitrogen ($O_2$, $O_3$, $H_2O$, and/or $H_2O_2$), the molar ratio between the disilane compound and the nitrogen-containing gas is preferably 10:1 to 1:50. In either case the molar ratio between the disilane compound and the oxygen-containing gas is preferably 50:1 to 1:10.

The overall pressure within the reaction chamber is preferably maintained in the range from 0.1 to 10 Torr, and the reaction temperature is preferably from 300° C. to 750° C.

The disilane compound (I) can be vaporized using a bubbler or a vaporizer during silicon (oxy)nitride production according to this invention. The bubbler can comprise a sealed container filled with a liquid disilane compound (I) or a solution comprising it, an injection conduit that injects carrier gas into the disilane compound in the sealed container, and a feed conduit that removes the disilane compound—vaporized and entrained into the carrier gas injected from the injection conduit into the disilane compound—from the sealed container and feeds this vaporized disilane compound into the reaction chamber. At its downstream end this feed conduit communicates with the CVD reaction chamber. The temperature and pressure within the sealed container must be maintained at constant or specified values.

A Direct Liquid Injection System (DLI-25) from the MKS Company or a VU-410A vaporizer from the Lintec Company, for example, can be used as the vaporizer. The disilane compound is vaporized using the vaporizer and fed to the reaction chamber.

BRIEF DESCRIPTION OF THE DRAWINGS

FIG. 1 contains a block diagram that illustrates one example of a CVD reaction apparatus well suited for execution of the inventive method for producing silicon (oxy)nitride films.

Figure 1:
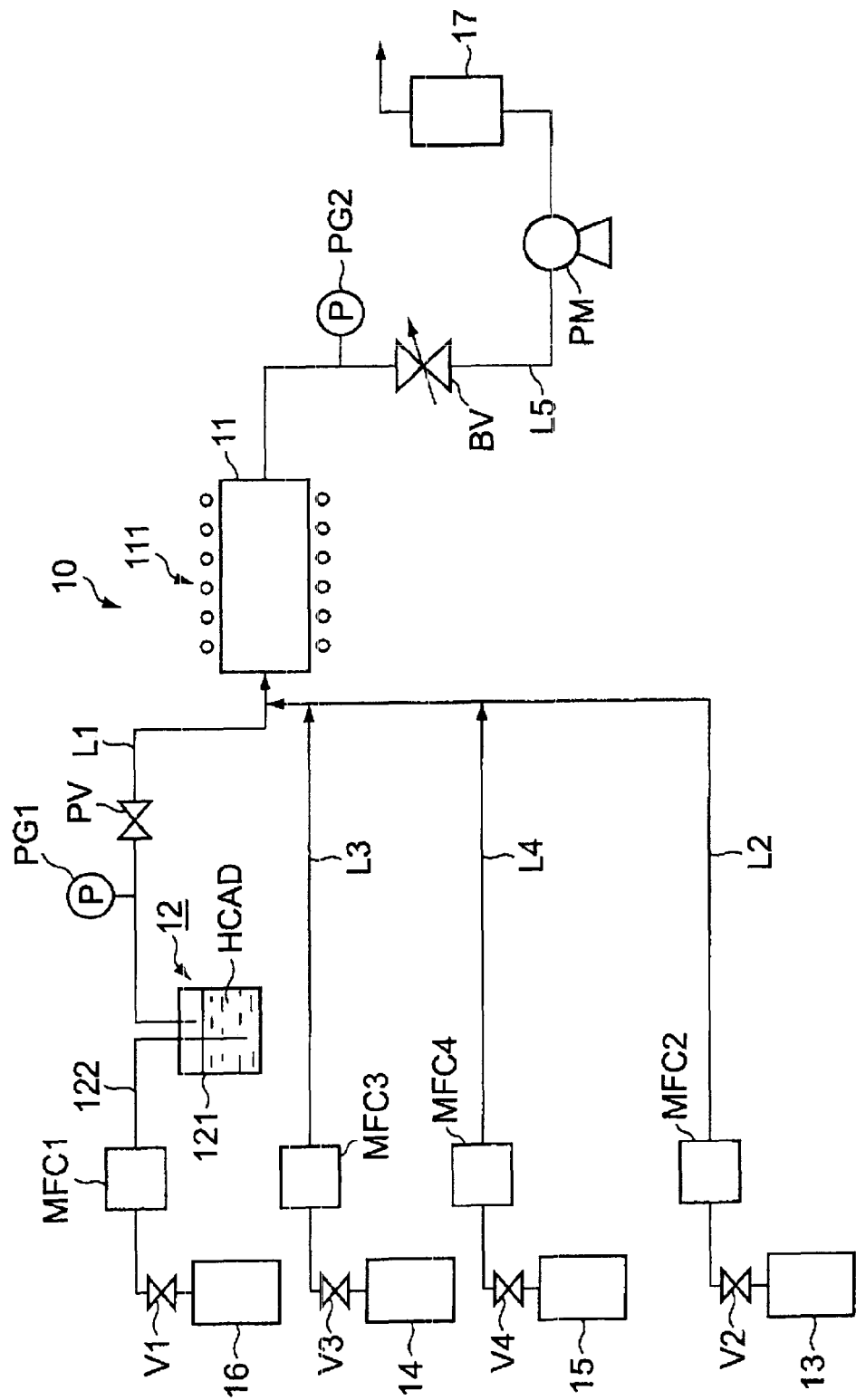
FIG. 1 contains a block diagram that illustrates a first embodiment of a CVD reaction apparatus that can be used to carry out the invention.

The CVD reaction apparatus 10 illustrated in FIG. 1 is provided with a CVD reaction chamber 11, a supply source 12 for the disilane compound (HCAD) according to this invention, a nitrogen-containing gas supply source 13, and a supply source 14 of dilution gas, such as an inert gas, that is introduced as necessary. The CVD reaction apparatus 10 is also provided with an oxygen-containing gas supply source 15 when silicon oxynitride is to be produced. The reaction chamber 11 is surrounded by a heating means 111 for the purpose of heating to the specified CVD reaction temperature (batch processing). A susceptor is heated in the case of single wafer processing.

In the case of the CVD reaction apparatus 10 illustrated in FIG. 1, the HCAD is introduced into the reaction chamber 11 in the gas phase due to the action of a bubbler. The HCAD supply source 12 is provided with a sealed container 121 that is loaded with liquid HCAD compound or solution. An injection conduit 122 is inserted into the sealed container 121 in order to inject carrier gas into the HCAD loaded in the sealed container 121; the carrier gas is injected from the supply source 16 for the carrier gas, e.g., nitrogen, across the valve V1 and mass flow controller MFC1. After its injection into the HCAD, the HCAD-entraining carrier gas passes through the pressure-control valve PV and into the line L1 and is introduced into the reaction chamber 11. A pressure sensor PG1 is connected to the line L1. Although not shown in the figure, at least 1 substrate (typically a semiconductor substrate such as a silicon substrate) is loaded in the reaction chamber 11. From 1 to 250 substrates (chuck- or wafer boat-loaded) can be present.

Nitrogen-containing gas, e.g., ammonia, is introduced from the nitrogen-containing gas supply source 13 across the valve V2 and the mass flow controller MFC2 and into the reaction chamber 11 through the line L2.

Dilution gas, which is introduced as necessary, can be introduced from the dilution gas supply source 14 across the valve V3 and the mass flow controller MFC3 and into the reaction chamber 11 through the line L3 and the line L2.

Oxygen-containing gas, which is introduced during production of silicon oxynitride films, can be introduced from the oxygen-containing gas supply source 15 across the valve V4 and the mass flow controller MFC4 and into the reaction chamber 11 through the line L4 and the line L2.

The outlet from the reaction chamber 11 is connected by the line L5 to a waste gas treatment apparatus 17. This waste gas treatment apparatus 17 functions to remove, for example, by-products and unreacted material, and to—exhaust the gas after abatement from the system. A pressure sensor PG2, a butterfly valve BV, and a pump PM are connected in the line L5. The various gases are introduced into the reaction chamber 11, the pressure within the reaction chamber 11 is monitored by the pressure sensor PG2, and the pressure is brought to its prescribed value by the opening and closing of the butterfly valve BV by the operation of the pump PM.

During operation, the container 121 is heated to, for example, 50° C. to 80° C., and the HCAD feed system, which comprises the line L1, is preferably heated to a temperature higher than the bubbler in order to prevent dew formation by the HCAD.

Figure 2:
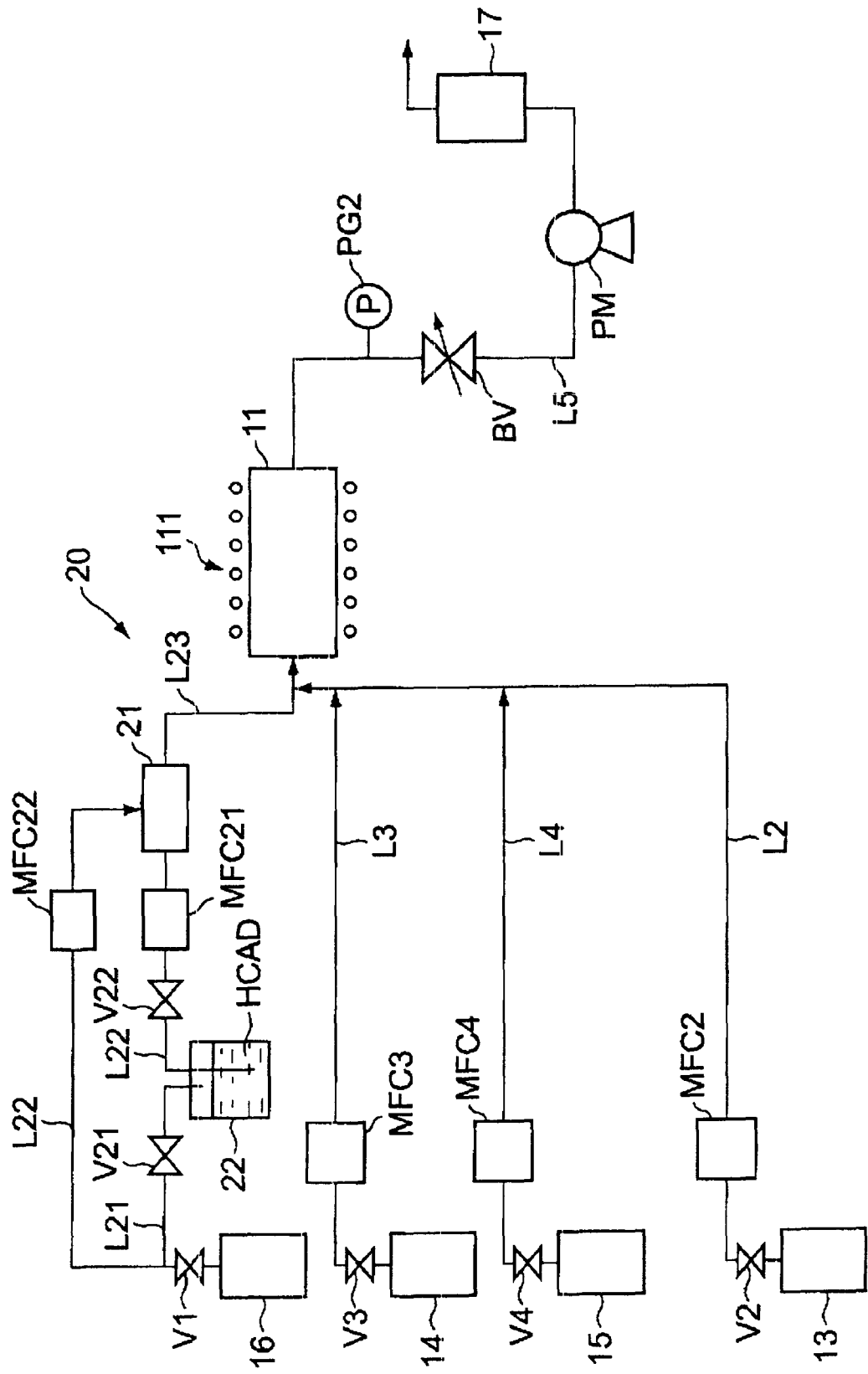
FIG. 2 contains a block diagram that illustrates a second embodiment of a CVD reaction apparatus that can be used to carry out the invention.

FIG. 2 contains a CVD reaction apparatus that has the same structure as the CVD reaction apparatus 10 illustrated in FIG. 1, with the exception that the CVD reaction apparatus in FIG. 2 contains a different HCAD feed system. Those elements that are the same in both figures have been assigned the same reference symbol and will not be considered again in detail.

The CVD reaction apparatus 20 illustrated in FIG. 2 is provided with a vaporizer 21. Carrier gas from the carrier gas source 16 passes across the valve V1 and through the line L21 and is introduced into the gas-phase region for the HCAD filled in liquid form in the sealed container 22. The pressure exerted by the carrier gas functions to move the liquid HCAD across the valve V22 and the mass flow controller MFC21, through the line L22, and into the vaporizer 21. Carrier gas from the carrier gas source 16 also passes through the line L22, which branches from the line L21, and is introduced into the vaporizer 21. The carrier gas and liquid HCAD introduced into the vaporizer 21 are heated in the vaporizer 21 to, for example, 60° C. to 200° C., and the HCAD is vaporized and is transported with the carrier gas through the line L23 and is introduced into the reaction chamber 11. The line L23 is preferably heated to 50° C. to −250° C. in order to prevent reliquefaction or dew formation by the HCAD.

| Reference symbols | |
|---|---|
| 10, 20 | CVD reaction apparatus |
| 11 | CVD reaction chamber |
| 12 | hydrocarbylaminodisilane (HCAD) supply source |
| 13 | nitrogen-containing gas supply source |
| 14 | dilution gas supply source |
| 15 | oxygen-containing gas supply source |
| 16 | carrier gas supply source |
| 17 | waste gas treatment apparatus |
| 21 | vaporizer |
| 22 | sealed container |
| 111 | heating means |
| 121 | sealed container |
| 122 | carrier gas injection conduit |
| L1-L5, L21-L23 | line |
| V1-V4, V21-V22 | Valve |
| PG1-PG2 | pressure sensor |
| MFC1-MFC4, MFC21-MFC22 | mass flow controller |
| BV | butterfly valve |
| PM | pump |

This invention will now be described in greater details in the following examples. However, the invention is not limited to these specific examples.

Example 1

The synthesis of $ClSi_2(NMe_2)_5$ has been done from the ammonolysis of hexachlorodisilane and lithium dimethylamide. Hexachlorodisilane (HCD) is used as the starting material so that the Si—Si direct bond remains in the molecule. n-hexane is used as a solvent and cooled at 0° C. A mixture of pentakis(dimethylamino) chloro disilane and hexakis(dimethylamino) disilane is obtained. Lithium dimethylamide is added to form a "lithium dimethylamide solution". HCD is added dropwise in the 0° C. lithium dimethylamide solution. Then the solution is stirred for 2 h at 0° C. then for 15 h at RT. The salt LiCl is then removed from the solution, and the n-hexane removed in vacuo. The resulting $ClSi_2(NMe_2)_5$ and other byproducts are separated by fractional distillation. The NMR spectra indicates that the samples obtained from this distillation process contain less than 5% vol of $Si_2(NMe_2)_6$.

Example 2

The precursor pentakis(dimethylamino) chloro disilane was dissolved in toluene 18.5 weight % to be delivered using a liquid delivery system. This percentage has been found to be optimum in terms of solubility and for an easy delivery to the vaporizer and then to the CVD chamber. The corresponding solution will be described below as "$Si_2(NMe_2)_5Cl$ solution". However, this definition comprises all solutions of $Si_2(NMe_2)_5Cl$ (or other products of the same "family" as explained with 1% to 20% weight of at least one solvent, preferably selected from the group comprising benzene, toluene, etc. . . .

Example 3

A typical set-up is described FIG. 1. An inert gas, such as helium, argon, nitrogen or the like having the purity required for semiconductor manufacturing was introduced into the bubbler so that the solution is introduced into the liquid mass flow controller and the vaporizer. The components of the solution are then vaporized at a suitable temperature in order to optimize the delivery. An inert gas, such as helium, argon, nitrogen or the like having the purity required for semi-conductor manufacturing is separately introduced into the vaporizer to carry the gaseous components of the solution to the CVD reactor. It can be mixed with an additional reactant such as ammonia.

Helium is considered as the most suitable carrier gas in this application.

Example 4

The different reactants are introduced into the CVD chamber as described on FIG. 1.
The feed rates of the different chemicals involved into the process are:
$Si_2(NMe_2)_5Cl$ solution: 0.08 g/min. He: 175 sccm. $NH_3$: 35 sccm
The deposition parameters are:
Vaporizer in which the "solution" is vaporized in gaseous form T: 110° C.
Deposition T: 525° C. CVD reactor pressure: 1.0 Torr. Duration: 20 minutes
The film has been characterized by AES and refractometry.
The corresponding deposition rate is 75 A/min
The film composition is then: $Si_{0.65} N_{0.14} C_{0.21}$
The results obtained in examples 2-4 are summarized on FIG. 2. The corresponding apparent activation energy is 14 kcal/mol, much lower than the activation energy of HCDS/$NH_3$ process, known as a process giving nitride and carbonitride films having excellent properties.

Example 5

The different reactants are introduced into the CVD chamber as described on FIG. 1.
The feed rates of the different chemicals involved into the process are:
$Si_2(NMe_2)_5Cl$ solution: 0.08 g/min. He: 175 sccm. $NH_3$: 35 sccm
The deposition parameters are:
Vaporizer T: 110° C. Deposition T: 500° C. CVD reactor pressure: 1.0 Torr.
Duration: 30 minutes
The film has been characterized by AES and refractometry.
The corresponding deposition rate is 40 A/min
The film composition is then: $Si_{0.62} N_{0.14} C_{0.23}$ Example 6

The different reactants are introduced into the CVD chamber as described on FIG. 1.
The feed rates of the different chemicals involved into the process are:
$Si_2(NMe_2)_5Cl$ solution: 0.08 g/min. He: 175 sccm. $NH_3$: 35 sccm
The deposition parameters are:
Vaporizer T: 110° C. Deposition T: 475° C. CVD reactor pressure: 1.0 Torr.
Duration: 30 minutes
The film has been characterized by AES and refractometry.
The corresponding deposition rate is 19 A/min
The film composition is then: $Si_{0.62} N_{0.15} C_{0.23}$ Example 7

The different reactants are introduced into the CVD chamber as described on FIG. 1.
The feed rates of the different chemicals involved into the process are:

$Si_2(NMe_2)_5Cl$ solution: 0.08 g/min. He: 175 sccm. $NH_3$: 35 sccm

The deposition parameters are:
Vaporizer T: 110° C. Deposition T: 450° C. CVD reactor pressure: 1.0 Torr.
Duration: 50 minutes
The film has been characterized by AES and refractometry.
The corresponding deposition rate is 6 A/min
The film composition is then: $Si_{0.56} N_{0.17} C_{0.26}$ Example 8

The different reactants are introduced into the CVD chamber as described on FIG. 1.
The feed rates of the different chemicals involved into the process are:
$Si_2(NMe_2)_5Cl$ solution: 0.16 g/min. He: 175 sccm. $NH_3$: 35 sccm The deposition parameters are:
Vaporizer T: 110° C. Deposition T: 450° C. CVD reactor pressure: 1.0 Torr.
Duration: 50 minutes
The film has been characterized by AES and refractometry.
The corresponding deposition rate is 11.2 A/min, about twice that obtained in the previous example where the feed rate of the precursor was twice lower.
The film composition is then: $Si_{0.62} N_{0.14} C_{0.24}$ Example 9

The different reactants are introduced into the CVD chamber as described on FIG. 1.
The feed rates of the different chemicals involved into the process are:
$Si_2(NMe_2)_5Cl$ solution: 0.16 g/min. He: 175 sccm. $NH_3$: 35 sccm The deposition parameters are:
Vaporizer T: 110° C. Deposition T: 425° C. CVD reactor pressure: 1.0 Torr.
Duration: 80 minutes
The film has been characterized by AES and refractometry.
The corresponding deposition rate is 3 A/min
The film composition is then: $Si_{0.56} N_{0.17} C_{0.26}$ Example 10

"Subatmospheric CVD" Experiments

The different reactants are introduced into the CVD chamber as described on FIG. 1.
The feed rates of the different chemicals involved into the process are:
$Si_2(NMe_2)_5Cl$ solution: 0.08 g/min. He: 175 sccm. $NH_3$: 35 sccm The deposition parameters are:
Vaporizer T: 110° C. Deposition T: 400° C. CVD reactor pressure: 100 Torr.
Duration: 80 minutes
The film has been characterized by AES and refractometry.
The corresponding deposition rate is 28 A/min
The film composition is then: $Si_{0.41} N_{0.51} C_{0.07}$ Example 11

The different reactants are introduced into the CVD chamber as described on FIG. 1.

The feed rates of the different chemicals involved into the process are:
$Si_2(NMe_2)_5Cl$ solution: 0.08 g/min. He: 175 sccm. $NH_3$: 35 sccm The deposition parameters are:
Vaporizer T: 110° C. Deposition T: 375° C. CVD reactor pressure: 100 Torr.
Duration: 80 minutes
The film has been characterized by AES and refractometry.
The corresponding deposition rate is 20 A/min
The film composition is then: $Si_{0.41} N_{0.51} C_{0.07}$ Example 12

The different reactants are introduced into the CVD chamber as described on FIG. 1.
The feed rates of the different chemicals involved into the process are:
$Si_2(NMe_2)_5Cl$ solution: 0.08 g/min. He: 175 sccm. $NH_3$: 35 sccm The deposition parameters are:
Vaporizer T: 110° C. Deposition T: 350° C. CVD reactor pressure: 100 Torr.
Duration: 80 minutes
The film has been characterized by AES and refractometry.
The corresponding deposition rate is 15 A/min
The film composition is then: $Si_{0.40} N_{0.51} C_{0.08}$ The apparent activation energy of the process according to examples 10 to 12 is 14 kcal/mol, very close to the $DCS/NH_3$ process, known as a process giving nitride or carbonitride films having excellent properties.

Comparative Example 13

This example (Table 1) summarizes the comparison between a SiN film obtained from a prior art $Si_2(NHEt)_6$ precursor and a SiN film obtained from the $Si_2(NMe)_5Cl$ precursor according to the invention. The etch rate of the compound according to the invention is 400 times less than the etch rate of the prior art layer from $Si_2(NHEt)_6$ which makes it particularly attractive to make SiN layers for etch-stop purpose.

TABLE 1

|  | $Si_2(NMe)_5Cl$ | $Si_2(NHEt)_6$ |
| --- | --- | --- |
| Precursor flow rate (ccm) | 0.05 | 0.05 |
| NH3 (sccm) | 35 | 35 |
| Deposition temperature (° C.) | 450 | 450 |
| Operating pressure (Torr) | 1 | 1 |
| Deposition rate (A/min) | 6 | 7 |
| Etch rate in 5% HF (A/min) | 5 | 2000 |

It will be understood that many additional changes in the details, materials, steps and arrangement of parts, which have been herein described in order to explain the nature of the invention, may be made by those skilled in the art within the principle and scope of the invention as expressed in the appended claims. Thus, the present invention is not intended to be limited to the specific embodiments in the examples given above.

What is claimed is:
1. A method for producing silicon nitride films by chemical vapor deposition in a reaction chamber said method comprising the steps of:

a) introducing a substrate into the reaction chamber, said substrate having a surface adapted to receive a silicon nitride film by chemical vapor deposition;
b) introducing a pentakis(dimethylamino) disilane compound with the general formula:

wherein Y is the amino group is $NH(C_nH_{2n+1})$ with $0 \leq n \leq 5$;
c) introducing a nitrogen-containing gas selected from the group comprising of ammonia, hydrazine, alkylhydrazine compounds, and hydrogen azide compounds into the reaction chamber; and
d) forming a silicon nitride film onto at least a portion of the surface of the substrate by reacting the disilane containing compound and the nitrogen-containing gas at a reaction temperature which is at least equal to the substrate surface temperature.

2. The method of claim 1, wherein the disilane compound contains less than 5% vol, of $Si_2(NMe_2)_6$.

3. The method of claim 1, wherein the molar ratio between the disilane compound and the nitrogen-containing gas introduced into the reaction chamber is 1:0 to 1:50, the total pressure within the reaction chamber is 0.1 to 10 Torr, and the reaction temperature is 300° C. to 650° C.

4. The method of claim 1, wherein the disilane compound is entrained as a gaseous product by a carrier gas by injecting and bubbling the carrier gas into the liquid disilane compound which is then moved through the delivery system and fed to the reaction chamber.

5. The method of claim 4, wherein the delivery system is maintained at a temperature which is comprised between 25° C. and −250° C.

6. The method of claim 1, wherein the disilane compound is vaporized using a vaporizer means and the vaporized disilane compound is then moved through the delivery system and fed to the reaction chamber.

7. The method of claim 6, wherein the vaporizer is heated at a temperature which is comprised between 60° C. and 200° C.

8. The method of claim 1, wherein the reaction chamber is loaded with from 1 to 250 semiconductor substrates mounted in one chuck or wafer boat.

9. A method for producing silicon oxynitride films by chemical vapor deposition in a reaction chamber comprising the steps of:

a) introducing a substrate into the reaction chamber, this substrate having a surface adapted to receive a film deposited thereon;
b) introducing a pentakis(dimethylamino) disilane compound with the general formula:

wherein Y is the amino group is $NH(C_nH_{2n+1})$ with $0 \leq b \leq 5$;
c) introducing a nitrogen-containing gas selected from the group comprising ammonia, hydrazine, alkylhydrazine compounds, and hydrogen azide compounds into the reaction chamber;
d) introducing an oxygen-containing gas selected from the group comprising $NO$, $N_2O$, $NO_2$, $O_2$, $O_3$, $H_2O$, and $H_2O_2$ into the reaction chamber loaded with at least a substrate; and
e) forming a silicon oxynitride film onto at least a portion of the surface of the substrate by reacting the disilane compound, the nitrogen-containing gas, and the oxygen-containing gas at a reaction temperature, which is at least equal to the substrate surface temperature.

10. The method of claim 9, wherein the disilane compound contains less than 5% vol, of $Si_2(NMe_2)_5$.

11. The method of claim 10, wherein the molar ratio between the disilane compound and the nitrogen-containing gas introduced into the reaction chamber is 1:0 to 1:50, the moral ratio between the disilane compound and the oxygen-containing gas is than 50:1 to 1:1, the total pressure within the reaction chamber is from 0.1 to 10 Torr, and the reaction temperature is from: 300° C. to 750° C.

12. The method of claim 9, wherein the disilane compound is entrained as a gas by a carrier gas, by injecting bubbling the carrier gas into the liquid disilane compound and then moving this gas through the feed system to be fed to the reaction chamber.

13. The method of claim 12, wherein the delivery system is maintained at a temperature between 25° C. and 250° C.

14. The method of claim 9, wherein the disilane compound is vaporized using a vaporized means and the vaporized disilane compound is then moved through the feed system and fed to the reaction chamber.

15. The method of claim 14, wherein the vaporizer is heated at a temperature comprised between 60° C. to 200° C.

16. The method of claim 9, wherein the reaction chamber is loaded with from 1 to 250 semiconductor substrates mounted in one chuck or wafer boat.

* * * * *